(12) United States Patent
Ko et al.

(10) Patent No.: US 11,621,245 B2
(45) Date of Patent: Apr. 4, 2023

(54) MICROELECTRONIC DEVICE PACKAGES WITH EMI SHIELDING, METHODS OF FABRICATING AND RELATED ELECTRONIC SYSTEMS

(71) Applicant: Micron Technology, Inc., Boise, ID (US)

(72) Inventors: Yeongbeom Ko, Boise, ID (US); Youngik Kwon, Boise, ID (US); Jungbae Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/892,084

(22) Filed: Jun. 3, 2020

(65) Prior Publication Data
US 2021/0384159 A1    Dec. 9, 2021

(51) Int. Cl.
| | |
|---|---|
| *H01L 25/065* | (2006.01) |
| *H01L 23/552* | (2006.01) |
| *H01L 25/18* | (2023.01) |
| *H01L 25/00* | (2006.01) |
| *H01L 21/56* | (2006.01) |

(52) U.S. Cl.
CPC ........ *H01L 25/0657* (2013.01); *H01L 21/563* (2013.01); *H01L 23/552* (2013.01); *H01L 25/18* (2013.01); *H01L 25/50* (2013.01); *H01L 2225/0651* (2013.01); *H01L 2225/06506* (2013.01); *H01L 2225/06517* (2013.01); *H01L 2225/06558* (2013.01); *H01L 2225/06562* (2013.01)

(58) Field of Classification Search
CPC ... H01L 23/552; H01L 25/117; H01L 25/0657
See application file for complete search history.

(56) References Cited

U.S. PATENT DOCUMENTS

| | | | |
|---|---|---|---|
| 6,919,631 B1 | 7/2005 | Hoffman et al. | |
| 7,464,225 B2 | 12/2008 | Tsem | |
| 7,721,010 B2 | 5/2010 | Schnell et al. | |
| 8,304,874 B2 | 11/2012 | Lee et al. | |
| 9,761,562 B2 | 9/2017 | Ye et al. | |
| 2004/0124518 A1 | 7/2004 | Kamezos | |
| 2005/0082664 A1 | 4/2005 | Funaba et al. | |
| 2006/0102992 A1* | 5/2006 | Kwon ................ | H01L 25/0657 257/685 |
| 2009/0079041 A1 | 3/2009 | Huang et al. | |
| 2009/0230531 A1 | 9/2009 | Do et al. | |
| 2010/0015760 A1 | 1/2010 | Kado et al. | |
| 2011/0024743 A1 | 2/2011 | Lee et al. | |
| 2014/0175673 A1 | 6/2014 | Kim et al. | |
| 2014/0225235 A1 | 8/2014 | Du | |

(Continued)

OTHER PUBLICATIONS

Taiwanese First Office Action for Application No. 110118627, dated Dec. 21, 2021, 16 pages.

*Primary Examiner* — Yu-Hsi D Sun
(74) *Attorney, Agent, or Firm* — TraskBritt

(57) ABSTRACT

This patent application relates to microelectronic device packages with internal EMI shielding, methods of fabricating and related electronic systems. One or more microelectronic devices of a package including multiple microelectronic devices are EMI shielded, and one or more other microelectronic devices of the package are located outside the EMI shielding.

15 Claims, 4 Drawing Sheets

(56) References Cited

U.S. PATENT DOCUMENTS

2014/0321189 A1 10/2014 Fai et al.
2016/0181207 A1 6/2016 Mahajan et al.
2019/0013299 A1* 1/2019 Lee .................... H01L 25/18

* cited by examiner

MICROELECTRONIC DEVICE PACKAGES WITH EMI SHIELDING, METHODS OF FABRICATING AND RELATED ELECTRONIC SYSTEMS

TECHNICAL FIELD

Embodiments disclosed herein relate to microelectronic device packages, methods of fabricating and related electronic systems. More particularly, embodiments disclosed herein relate to microelectronic device packages incorporating internal electromagnetic interference (EMI) shielding, methods for fabricating such packages and electronic systems incorporating such packages.

BACKGROUND

Electromagnetic interference (EMI) (also termed radiofrequency interference (RFI) when in the radiofrequency spectrum) with operation of microelectronic devices (e.g., semiconductor devices) may be characterized as a disturbance in operation of an electrical circuit by electromagnetic induction, electrostatic coupling, or conduction generated by an external source. As microelectronic devices become ever-smaller with higher circuit densities and operate at higher speeds with lower power and data signal strengths, EMI becomes of greater significance.

DETAILED DESCRIPTION

Figure 1A:
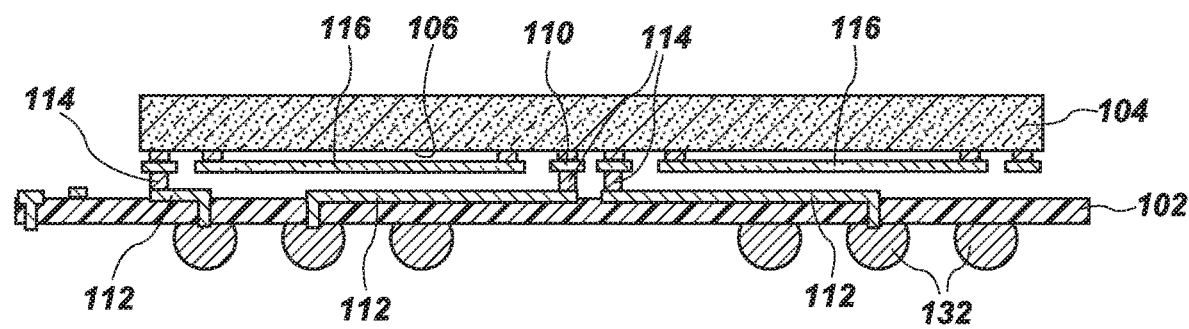
FIGS. 1A through 1E are schematic side elevations of a method of fabricating a microelectronic device package including an internal EMI shield according to embodiments of the disclosure, FIG. 1E illustrating a completed package.

Embodiments of the disclosure relate to microelectronic device packages having internal EMI shielding of at least one microelectronic device of a package including multiple microelectronic devices, and to electronic systems incorporating one or more such microelectronic device packages. Methods of fabricating such microelectronic device packages, and particularly packages including wire bond electrical connections, are also described.

The following description provides specific details, such as sizes, shapes, material compositions, locations and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional process acts and apparatus employed in the industry, suitably modified in accordance with the disclosure. In addition, the description provided below may not form a complete process flow for fabricating microelectronic device packages incorporating internal EMI shielding. Only those process acts and structures necessary to understand the embodiments of the disclosure are described in detail below.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In the description and for the sake of convenience, the same or similar reference numerals may be used to identify features and elements common between various drawing figures.

As noted above, EMI, including but not limited to RFI, has become a significant issue in terms of degradation of microelectronic device performance. The significance varies, however, with the structure and function of a given microelectronic device, as EMI issues with a package including a microelectronic device serving as a communication hub for, or controlling, other microelectronic devices in a master/slave architecture package may impair performance of the package as a whole. For example, performance of a package including a memory controller packaged with a stack of memory dice may be compromised by EMI affecting the controller. Similarly, a stack of memory dice with one of the dice configured as a master and the other dice as slaves, as is the case in a heterogeneous memory system (HMS), may exhibit EMI-compromised performance. Similarly, a stack of DRAM employed in a master/slave architecture may exhibit substantial EMI-resistance if the master die is EMI-shielded. In addition, a microprocessor, a graphics processing unit (GPU), an application specific integrated circuit (ASIC) or some field programmable gate arrays (FPGAs), may be desirably be EMI-shielded, while additional microelectronic devices of a package, for example static random access memory (SRAM), magnetorestrictive random access memory (MRAM) or error-correcting memory may not be significantly EMI-susceptible.

Another issue arising with stacked microelectronic devices arises when microelectronic devices (e.g., semiconductor dice) in a package are interconnected and connected to a package substrate by bond wires of, for example, aluminum, silver, gold and more recently, copper. Wire bonding of semiconductor dice in an assembly to be packaged may be effected by preheating the package substrate and any previously connected semiconductor dice on a heat block of a bond stage before bonding a wire tip extended from a capillary tip of the wire bond tool to a bond pad of a die, extending the wire to another bond pad of another die or substrate, and bonding the wire to the other bond pad. While the heat block may, for example, apply heat on the order of about 150° C. to about 160° C. to a substrate located on the upper surface of the bond stage, heat actually reaching each higher level of semiconductor dice mounted on the substrate may be substantially reduced before reaching a target bond pad due to a heat gradient attributable in large part to the insulating characteristics of the substrate, other previously wire bonded dice on the substrate, and dielectric bond line materials between the substrate and an adjacent die, and between dice of the stack. In some instances, the heat gradient may exceed 10° C. per the substrate and each die level in the stack. Accordingly, the potential for defective wire bonds due to inadequate temperatures at wire bond sites increases with each component level above the bond stage. Further, bond wires between, for example, a controller or other master die at the bottom of a die stack and one or more dice at the top of the stack may be excessively long and subject to shorting with other bond wires, or breakage, due to so-called wire bond sweep occurring when a flow front of encapsulant material contacts the bond wires in a transfer molding operation.

U.S. Pat. No. 9,761,562, assigned to the Assignee of the disclosure, provides various examples of semiconductor device packages of a master/slave architecture including a controller die and multiple memory dice, which may be of the same (e.g., all NAND Flash) or of different (e.g., NAND Flash and DRAM) types. As illustrated and described in the '562 patent, multiple memory dice are stacked in mutually partially offset "shingle stack" arrangement to expose bond pads along a common lateral edge of each die in the stack for wire bonding. Of course, the master semiconductor die may be configured as a memory die (e.g., DRAM die) to function as a communication hub die for slave dice, also configured as memory (e.g., DRAM) dice. In either such instance, the master die may be characterized as a high power density die which, during operation, generates a significantly higher amount of heat than the slave dice. Although not illustrated in the '652 patent, it is known to provide an EMI shield surrounding all of the semiconductor dice of a package, as shown and described in published U.S. Patent Applicant US 2014/0321189 A1.

As can be appreciated from the above examples, multiple microelectronic component and material levels present heat transfer issues from a heat source in the form of a heat block of a bond stage under the package substrate to the locations of bond pads to be wire bonded, increasing the potential for defective wire bonds at ever-higher component levels. In addition, heat transfer during operation from a master die at the bottom of a dies stack is substantially impaired by its supporting substrate, by the slave dice, by dielectric materials in the bond line, and by an encapsulant such as an epoxy molding compound (EMC).

Referring now to FIGS. 1A through 1E of the drawings, a method of fabricating a microelectronic device package and resulting package 100 (FIG. 1E) according to embodiments of the disclosure is illustrated.

As depicted in FIG. 1A, a substrate 102 bearing conductive traces 112 is connected to a microelectronic device in the form of, for example, master die 104 having conductive elements 114 extending over active surface 106 from bond pads 110 a redistribution layer (RDL) or integral (i.e., of metallization formed as part of a microelectronic device on the active surface) redistribution layer (iRDL) 116 to terminal portions of conductive (e.g., copper) traces 112. Conductive elements 114 may be copper pillars capped with solder tips and bonded to terminal portions (e.g., copper capped by a nickel barrier) of conductive traces 112 by mass reflow of the solder in an over, or by thermocompression bonding. Conductive elements 114 may also be configured as copper pillars, and diffusion bonded by thermocompression bonding to terminal portions of conductive traces 112. While external conductive elements 132 in the form of solder bumps are depicted in FIGS. 1A-1E for convenience, typically they would not be formed on or applied to substrate 102 until after an EMC 130 is applied as shown in FIG. 1E.

Figure 1B:
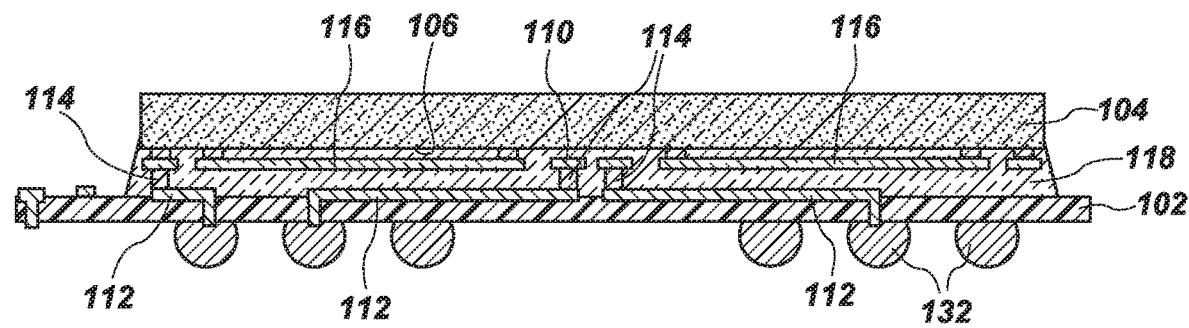

As shown in FIG. 1B, a dielectric material 118 is employed to underfill the bond line between master die 104 and substrate 102. Dielectric material 118 may be a capillary underfill material introduced after bonding of conductive elements 114 to terminal portions of conductive traces 112, or may be a non-conductive film (NCF) disposed over active surface 106 of master die 104, or over the upper surface of substrate 102 before master die 104 is superimposed over substrate 102.

Figure 1C:
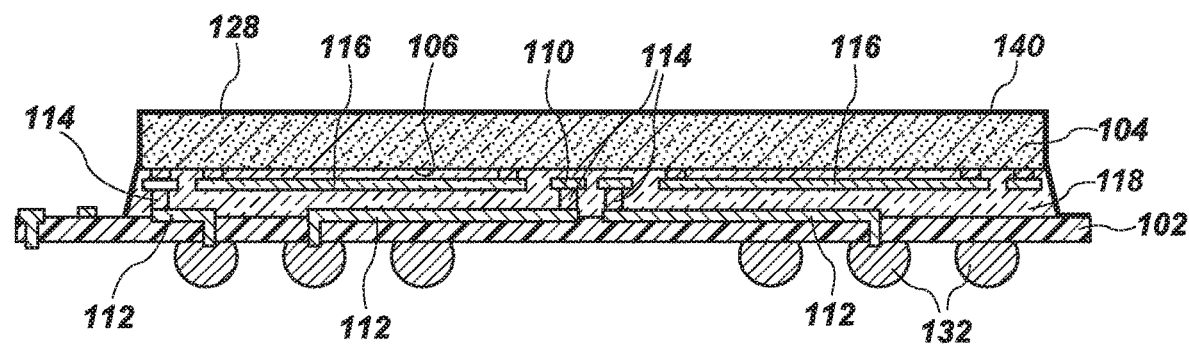

As shown in FIG. 1C, an EMI shield 140, which may be of a metal material (e.g., copper), is formed over the back side 128 and sides of master die 104, extending over the sides of dielectric material 118 and on to the upper surface of substrate 102 as a peripheral flange. The back side 128 and sides of master die 104 may be coated with a passivation material (not shown), for example of a polyimide, silicon nitride or TEOS, to prevent shorting between the EMI shield 140 and master die 104. The metal material may be deposited over the master die 104, sides of dielectric material 118 and the upper surface of substrate 102 in one or more levels (e.g., a seed material followed by another, thicker material of the same or different metal) by, for example physical vapor deposition (i.e., sputtering), electroplating or electroless plating after suitable masks are applied to the surface of substrate 102 surrounding the area for the EMI shield 140 to prevent unwanted coating of selected portions of substrate 102 and conductive traces 112 on the upper surface of substrate 102 with metal material and resultant shorting between conductive traces 112. The metal material of the EMI shield 140 may have a thickness, for example, of about 1 μm to about 5 μm. The EMI shield may, but need not be, conformal to the master die 104 and sides of dielectric material 118. In some embodiments, the EMI shield 140 may cover all sides of the master die 104, in some embodiments the EMI shield 140 may cover all sides of dielectric material 118 and in some embodiments the EMI shield 140 may extend over each side of dielectric material 118 and onto the upper surface of substrate 102.

Figure 1D:
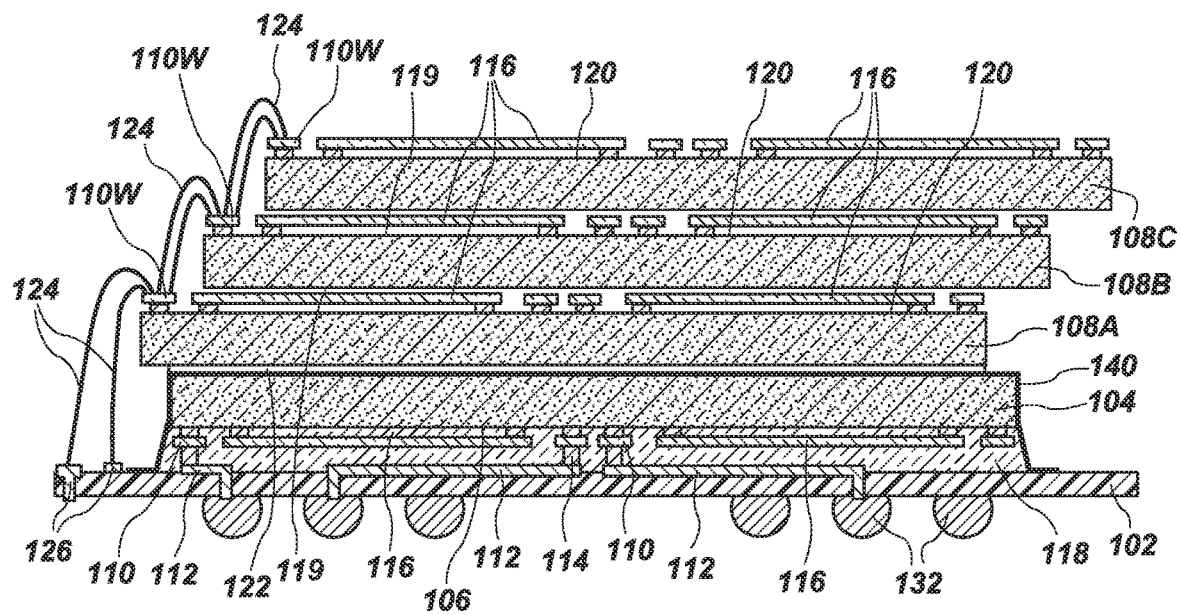
Figure 1E:
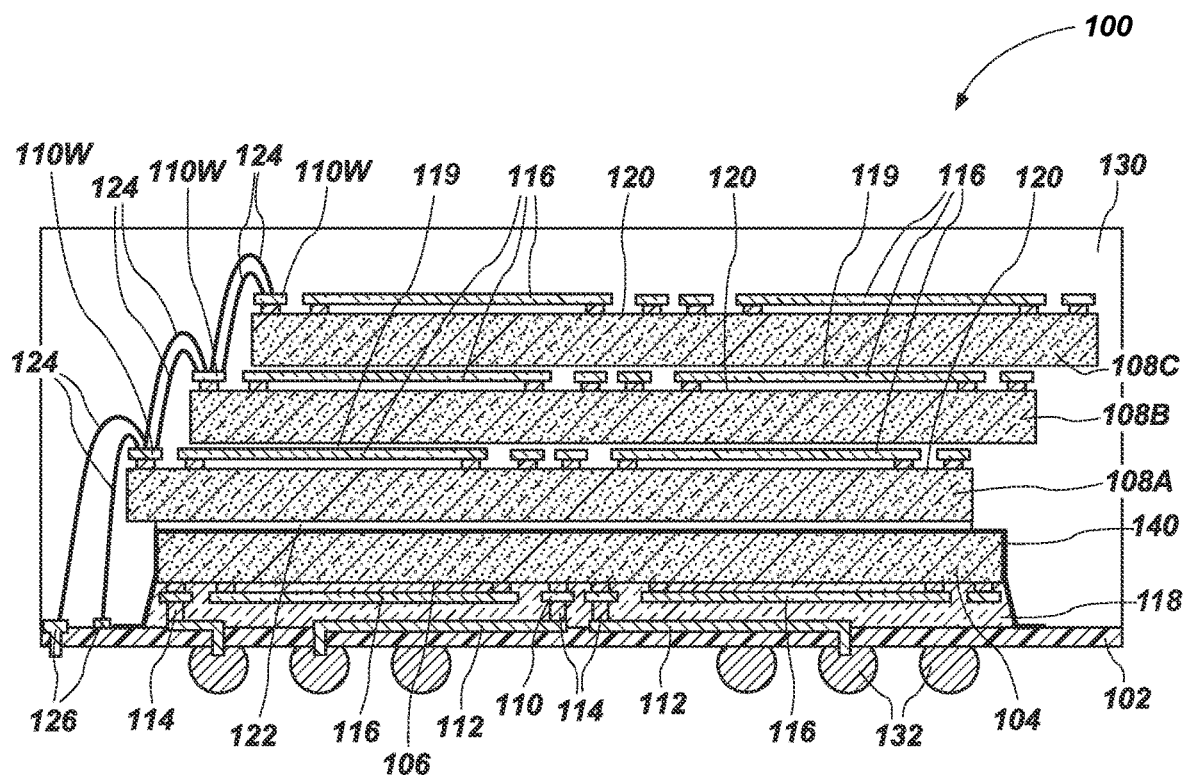

As shown in FIG. 1D, other microelectronic devices in the form of, for example, slave dice 108A, 108B and 108C, each having an RDL or iRDL over its respective active surface 120, is stacked in a shingle stack configuration, with each slave die 108A, 108B and 108C having wire bond pads 110W rerouted to a common lateral edge. Slave die 108A may be adhered to the back side of master die 104 using a dielectric adhesive material 122. Slave dice 108B and 108C may each be bonded over RDL or iRDL 116 of a next lower slave die 108A and 108B, respectively, with a dielectric material 119 in the bond line. The assembly may then be preheated on a heat block of a bond stage. Bond wires 124 are then extended to form wire bonds between bond pads 110W of slave dice 108A, 108B and 108C and between one or more of slave dice 108A-108C and terminal pads 126 of substrate 102, terminal pads 126 being operably coupled for data signal communication through conductive traces 112 of substrate to master die 104 through conductive elements 114 and to power and ground\bias traces 112 of substrate 102.

As shown in FIG. 1E, the assembly may be encapsulated by, for example, transfer molding in an EMC 130 surrounding dice 104, 108A-108C and bond wires 124. External conductive elements 132 on the underside of substrate 102, for example solder bumps, connect through conductive traces 112 of substrate 102 for provision of power and ground\bias to master die 104 through conductive elements 114 and to slave dice 108A-108C through bond wires 124, and to master die 104 for data signal communication through conductive elements 114.

As may be appreciated by those of ordinary skill in the art, application or formation of an EMI shield over a specific microelectronic device susceptible to EMI and after connection to a substrate and bond line filling with a dielectric material, without shielding an entire microelectronic device package, may be effected at an earlier stage of fabrication. EMI shield integrity may be tested at this early stage, as well as confirmation of the absence of shorts between the EMI shield and conductors of the assembly. Further, the use of a DCA connection between the master die and the substrate with communications between the master die and various slave dice routed through conductive traces of the substrate and then through bond wires eliminates a number of bond wires and also shortens bond wire paths, reducing the potential for shorting due to wire bond sweep.

In addition to the advantages noted above, the presence of a metal EMI shield over the master die 104 and extending peripherally over an upper surface of the package substrate 102 enhances heat transfer beneficially in two aspects. In one instance, the EMI shield 140 enhances upward heat transfer from a heat block of a wire bond tool bond stage to the slave dice 108A-108C, and specifically to the bond pads 110W of the slave dice 108A-108C to which bond wires 124 are to be attached, reducing the potential for defective bond wire-to-bond pad attachment. In addition, the metal EMI shield 140 enhances outward heat transfer from the master die 104 during operation of the microelectronic device package 100 (FIG. 1E).

Further, while described in terms of a single microelectronic device being shielded internally in a multiple device package, more than one microelectronic device may be shielded internally, with other microelectronic devices of the package remaining unshielded. In addition, the microelectronic devices in a given package may not necessarily be configured for, and connected in, a master/slave relationship but nonetheless one microelectronic device of the package may require EMI shielding to avoid compromised performance. Thus, the terms "master die" and "master microelectronic device" mean and include a semiconductor die or other microelectronic device desirably EMI shielded by an EMI shield internal to a package including one or more other semiconductor dice or other microelectronic devices of the package outside the internal EMI shield.

Figure 2:
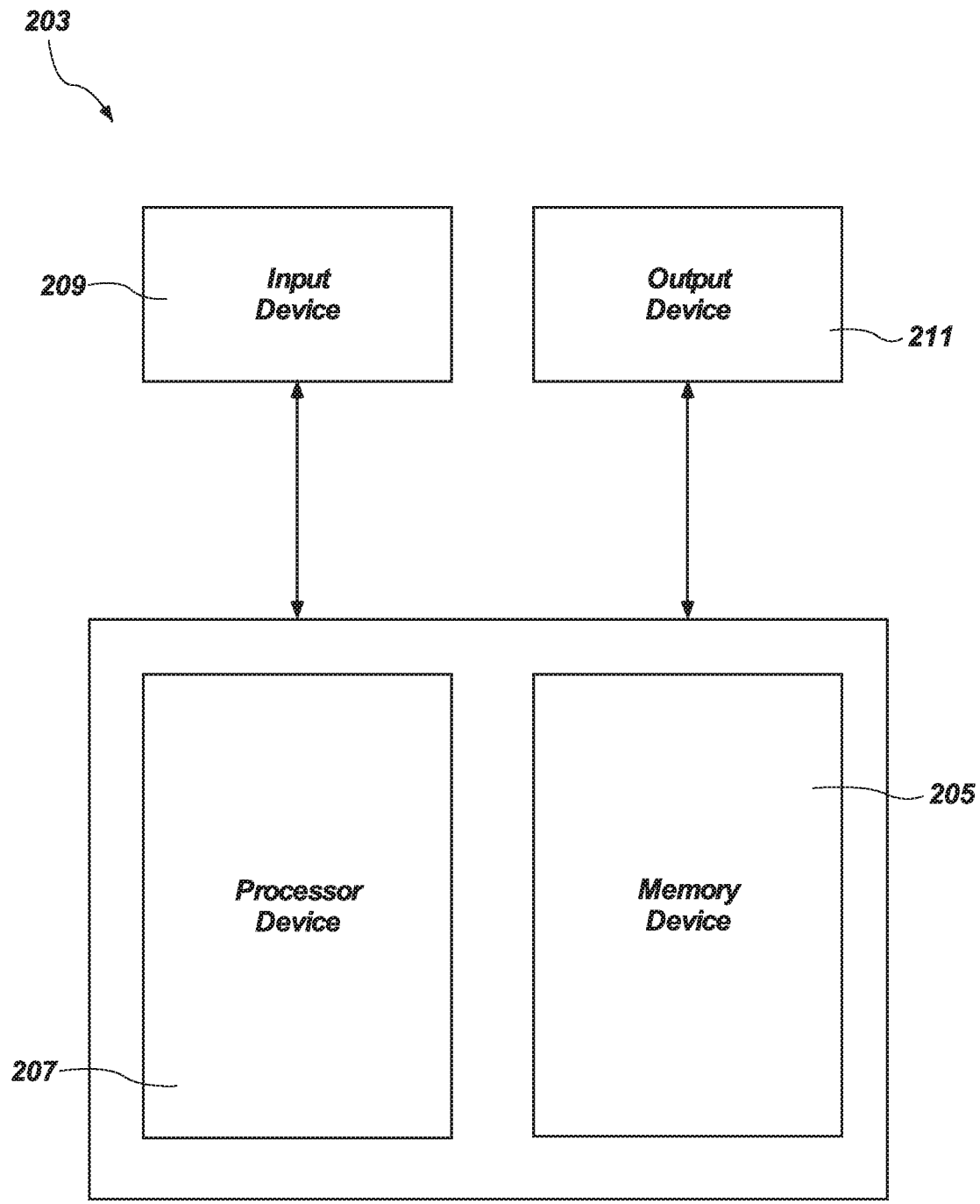
FIG. 2 is a block diagram of an electronic system including one or more microelectronic device packages including an internal EMI shield according to embodiments of the disclosure.

Microelectronic device packages incorporating internal EMI shielding and fabricated according to embodiments of the disclosure may be used in electronic systems. For example, FIG. 2 is a block diagram of an electronic system 203, in accordance with embodiments of the disclosure. The electronic system 203 may include, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, an automotive infotainment system, a vehicle engine control system, a self-driving vehicle control system, etc. The electronic system 203 includes at least one memory device 205. The at least one memory device 205 may include, for example, packaged memory dice having an internal EMI shield specific to a master die.

The electronic system 203 may further include at least one electronic signal processor device 207 (often referred to as a "microprocessor"). The electronic signal processor device 207 may include an internal EMI shield according to embodiments of the disclosure, with associated memory (e.g., SRAM) of the package external to the EMI shield. The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may include a single touchscreen device that can be used both to input information to the electronic system 203 and to output visual information to a user. The input device 209 and the output device 211 may communicate electrically with one or more of the memory device 205 and the electronic signal processor device 207.

Figure 3:
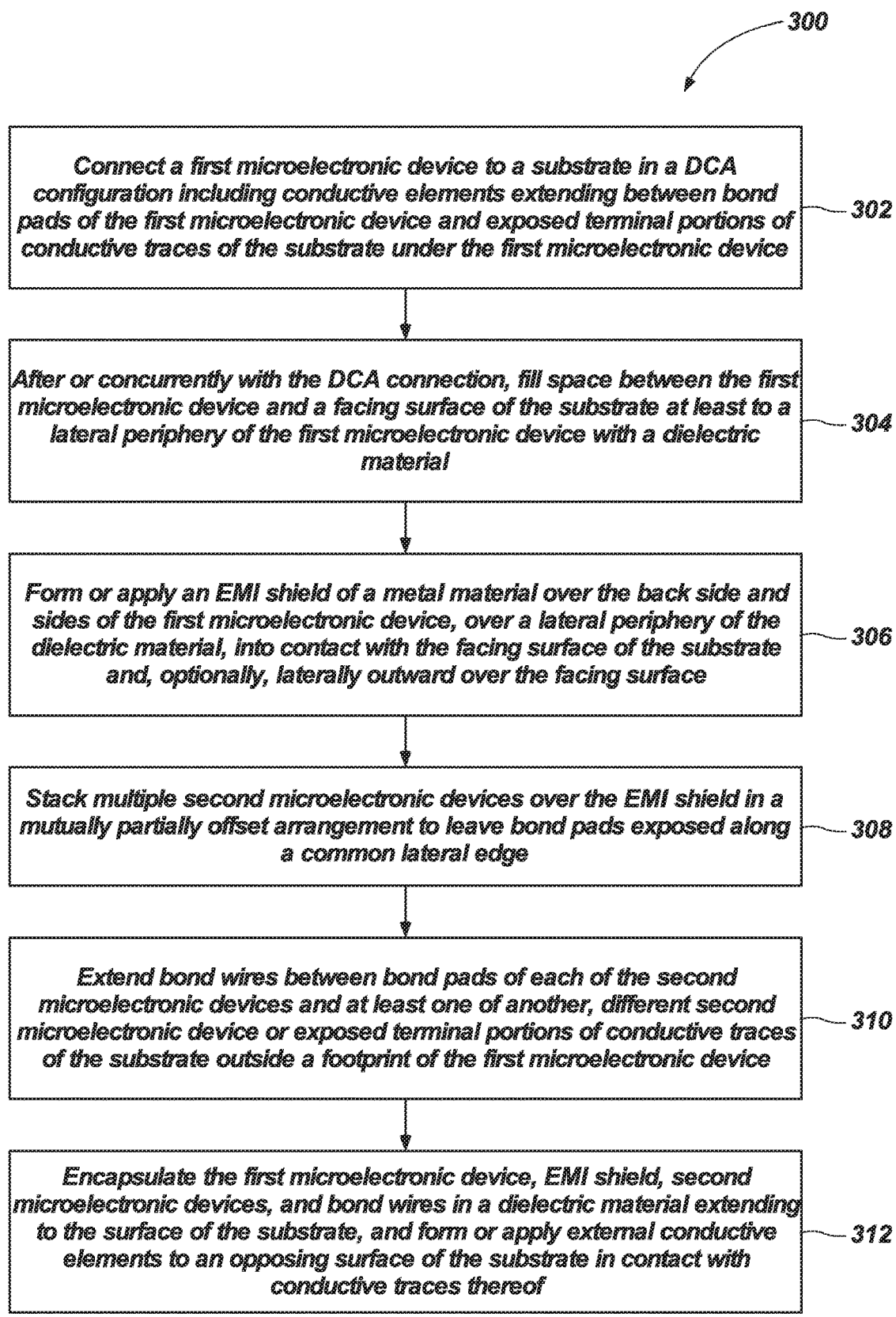
FIG. 3 is a flow chart of a method of fabricating a microelectronic device package according to embodiments of the disclosure.

As depicted in the flow diagram of FIG. 3 in their broadest sense, embodiments of the disclosure may be implemented by a method 300 including an initial act 302 of connecting a first microelectronic device to a substrate in a DCA configuration including conductive elements extending between bond pads of the first microelectronic device and exposed terminal portions of conductive traces of the substrate under the first microelectronic device. Space between the first microelectronic device and a facing surface of the substrate is filled at least to a lateral periphery of the first microelectronic device with a dielectric material in act 304, which may be performed after or concurrently with the DCA connection. In act 306, an EMI shield of a metal material may be formed or applied over the back side and sides of the first microelectronic device, over a lateral periphery of the dielectric material, into contact with a surface of the substrate and, optionally, laterally outward over the facing surface. In act 308, multiple second microelectronic devices are stacked over the EMI shield in a mutually partially offset arrangement leaving bond pads exposed along a common lateral edge. In act 310, bond wires are extended between bond pads of each of the second microelectronic devices and at least one of another, different second microelectronic device or exposed terminal portions of conductive traces of the substrate outside a footprint of the first microelectronic device. In act 312, the first microelectronic device, EMI shield, second microelectronic devices, and bond wires are encapsulated in a dielectric material extending to the surface of the substrate, and external conductive elements are formed on or applied to an opposing surface of the substrate in contact with conductive traces thereof.

As used herein, the term "EMI shield" means and includes structures, films, layers and coatings of a configuration and material sufficient to substantially block electromagnetic interference, including but not limited to radiofrequency interference between a source of such interference and one or more microelectronic devices. The EMI shield may be of an elemental metal or other metal material or may be of a nonmetal, such as graphene. The EMI shield may be conformal or nonconformal, imperforate (i.e., solid), or configured as a web, mesh, foam or other structure exhibiting discontinuities.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example, substrates having multiple metal layers in the form of traces and is interposed with dielectric layers (e.g., resin-glass weave polymers). For example, conventional BGA packages include multiple die and encapsulation (e.g., epoxy molding compound (EMC)) on one side of an organic substrate and an array of solder balls on the other side.

As used herein, the term "microelectronic device" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrate segments including more than one die location.

As used herein, the term "memory device" means and includes, by way of non-limiting example, semiconductor and other microelectronic devices exhibiting memory functionality, but not excluding other functionality unless otherwise clearly indicated by the context of use of the term. Stated another way, and by way of example only, the term "memory device" means and includes not only conventional memory in the form of DRAM, NAND, etc., but also by way of example only, an application specific integrated circuit (ASIC) (e.g., a system on a chip (SoC)), a microelectronic device combining logic and memory, or a graphics processing unit (GPU) incorporating memory.

As used herein, the terms "metal" and "metal material" mean and include, unless otherwise expressly stated, elemental metals, metal alloys and combinations (e.g., layers) of different and adjacent metals or metal alloys.

CONCLUSION

Embodiments of the disclosure include a microelectronic device package comprising a substrate including conductive traces having terminal portions exposed on a surface thereof, a microelectronic device having an active surface facing the surface of the substrate and connected to terminal portions of the conductive traces under the microelectronic device through conductive elements extending directly between the microelectronic device and the terminal portions, and a dielectric material between the microelectronic device and the substrate. An EMI shield extends over a back side and sides of the microelectronic device and a periphery of the dielectric material to contact the surface of the substrate. At least one other microelectronic device is over the EMI shield and has an active surface with bond pads thereon facing away from the EMI shield, and bond wires extend between the bond pads and terminal portions of the conductive traces outside a periphery of the microelectronic device.

Embodiments of the disclosure include a semiconductor device package comprising a substrate including terminal portions of conductive traces on a surface thereof, a master semiconductor device connected to terminal portions of the conductive traces under the master semiconductor device through conductive elements in a direct chip attach (DCA) configuration and dielectric material filling space between the master semiconductor device and the substrate to a periphery at least adjacent sides of the master semiconductor device. A conformal metal EMI shield is located over a back side and the sides of the master semiconductor device and peripheral surfaces of the dielectric material to and laterally over the surface of the substrate, two or more slave semiconductor devices each having bond pads thereon are stacked over the EMI shield and bond wires extend between the bond pads of each of the slave semiconductor devices and at least one of terminal portions exposed beyond the master semiconductor device and bond pads of another slave semiconductor die.

Embodiments of the disclosure include a method of fabricating a semiconductor device package comprising operably coupling a semiconductor die to terminals of a substrate in a direct chip attach configuration, filling a space between the semiconductor die and the substrate with a dielectric material at least to a periphery of the semiconductor die, forming or applying a EMI shield over a back side and sides of the semiconductor die and over a peripheral surface of the dielectric material to the substrate, placing two or more other semiconductor dice over the EMI shield over the back side of the semiconductor die with bond pads facing upward and extending bond wires between bond pads of the other semiconductor dice and bond pads of at least one different other semiconductor die, terminals of the substrate, or both.

Embodiments of the disclosure include an electronic system comprising one or more input devices, one or more output devices, at least one microprocessor device and at least one memory device. At least one of the at least one microprocessor device or the at least one memory device is configured as a package of multiple microelectronic devices including an EMI shield internal to the package over at least one microelectronic device of the package, at least one other microelectronic device of the package being external to the EMI shield.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of one or more other disclosed embodiments while still being encompassed within the scope of the disclosure.

What is claimed is:

1. A microelectronic device package, comprising:
   a substrate including conductive traces having terminal portions exposed on a surface of the substrate;
   a microelectronic device having an active surface facing the surface of the substrate and connected to terminal portions of the conductive traces under the microelectronic device through conductive elements extending directly between the microelectronic device and the terminal portions;
   a dielectric material extending at least to lateral peripheries of the microelectronic device in a bond line between the microelectronic device and the substrate;
   an electromagnetic interference (EMI) shield extending over and in contact with a back side and all sides of the microelectronic device, over and in contact with a periphery of the dielectric material to the surface of the substrate;
   at least one other microelectronic device over the EMI shield and having an active surface with bond pads thereon facing away from the EMI shield;
   bond wires extending between the bond pads and terminal portions of the conductive traces outside a periphery of the EMI shield; and
   a single dielectric material external to the EMI shield and encapsulating the EMI shield only on an exterior thereof, the at least one other microelectronic device and the bond wires, the dielectric material contacting the surface of the substrate and extending to a substrate periphery.

2. The microelectronic device package of claim 1, the at least one other microelectronic device comprising two or more other microelectronic devices stacked in a mutually laterally offset arrangement with bond pads adjacent a lateral edge thereof, each other microelectronic device above a lowermost other microelectronic device exposing the bond pads adjacent a lateral edge of a next lower microelectronic device; and further comprising bond wires extending from bond pads of the two or more other microelectronic devices to at least one of bond pads of a different other microelectronic device or terminal portions of the conductive traces outside the periphery of the microelectronic device.

3. The microelectronic device package of claim 2, the microelectronic device and the two or more other microelectronic devices being respectively configured to operate in combination in a master/slave relationship.

4. The microelectronic device package of claim 3, wherein the microelectronic device is configured as a master memory device and the two or more other microelectronic devices are each configured as a slave memory device.

5. The microelectronic device package of claim 3, wherein the microelectronic device is a logic device configured as a memory controller and the two or more other microelectronic devices are configured as memory devices.

6. The microelectronic device package of claim 2, the microelectronic device is a semiconductor die including an RDL or iRDL over the active surface rerouting at least some bond pads to bond pad locations aligned with terminal portions of the conductive traces under the semiconductor die, the conductive elements extending between the bond pad locations and the terminal portions under the semiconductor die.

7. The microelectronic device package of claim 2, the two or more other microelectronic devices being other semiconductor dice each including an RDL or iRDL over the active surface thereof rerouting at least some bond pad locations thereon to bond pads adjacent the lateral edge of each respective other semiconductor die.

8. The microelectronic device package of claim 1, wherein the EMI shield is a metal material, at least some portions of the metal material extending laterally from sides of the EMI shield outward over, parallel to and in contact with the surface of the substrate.

9. The microelectronic device package of claim 1, further comprising:
 external conductive elements coupled to conductive traces of the substrate and protruding from a surface of the substrate opposite the microelectronic device.

10. The microelectronic device package of claim 1, wherein:
 the microelectronic device is a microprocessor device; and
 the at least one other microelectronic device is a memory device.

11. A semiconductor device package, comprising:
 a substrate including terminal portions of conductive traces on a surface thereof;
 a master semiconductor device connected to terminal portions of the conductive traces under the master semiconductor device through conductive elements in a direct chip attach (DCA) configuration;
 dielectric material filling space between the master semiconductor device and the substrate to a periphery at least adjacent all sides of the master semiconductor device;
 a conformal metal electromagnetic interference (EMI) shield over a back side and all sides of the master semiconductor device and all peripheral surfaces of the dielectric material to and laterally over, parallel to and in contact with the surface of the substrate;
 two or more slave semiconductor devices stacked over the EMI shield and each having bond pads thereon:
 bond wires extending between the bond pads of each of the slave semiconductor devices and at least one of terminal portions exposed beyond the EMI shield and bond pads of another slave semiconductor die; and
 a single epoxy molding compound (EMC) encapsulating the bond wires, the two or more slave semiconductor devices, only exterior surfaces of the EMI shield and extending over the surface of the substrate to a lateral periphery thereof.

12. The semiconductor device package of claim 11, bond pads of each of the two or more slave semiconductor devices being adjacent a lateral edge thereof, and each slave semiconductor device other than a lowermost slave semiconductor device being laterally offset from an adjacent lower slave semiconductor device to leave exposed the bond pads adjacent the lateral edge of a lower slave semiconductor device.

13. The semiconductor device package of claim 11, further comprising:
 external conductive elements connected to traces of the substrate and protruding from a surface thereof opposite the EMC.

14. The semiconductor device package of claim 11, wherein the master semiconductor device is a logic die configured as a memory controller or a memory die configured as a master die and the slave semiconductor devices are configured as slave memory dice.

15. The semiconductor device package of claim 11, wherein each of the master semiconductor device and the two or more slave semiconductor devices includes an RDL or an iRDL rerouting bond pads on an active surface thereof to different locations over an active surface thereof.

\* \* \* \* \*